(12) United States Patent
Chuang et al.

(10) Patent No.: US 10,290,716 B2
(45) Date of Patent: May 14, 2019

(54) SEMICONDUCTOR DEVICE HAVING INTERFACIAL LAYER AND HIGH κ DIELECTRIC LAYER

(71) Applicant: TAIWAN SEMICONDUCTOR MANUFACTURING CO., LTD., Hsinchu (TW)

(72) Inventors: Kuo-Sheng Chuang, Hsinchu (TW); You-Hua Chou, Hsinchu (TW); Ming-Chi Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/663,791

(22) Filed: Jul. 30, 2017

(65) Prior Publication Data

US 2019/0006476 A1    Jan. 3, 2019

Related U.S. Application Data

(60) Provisional application No. 62/526,984, filed on Jun. 29, 2017.

(51) Int. Cl.
| | |
|---|---|
| *H01L 21/02* | (2006.01) |
| *H01L 21/28* | (2006.01) |
| *H01L 21/67* | (2006.01) |
| *H01L 29/08* | (2006.01) |
| *H01L 29/10* | (2006.01) |
| *H01L 29/40* | (2006.01) |
| *H01L 29/51* | (2006.01) |

(Continued)

(52) U.S. Cl.
CPC ...... *H01L 29/408* (2013.01); *H01L 21/02236* (2013.01); *H01L 21/28255* (2013.01); *H01L 21/6719* (2013.01); *H01L 21/67109* (2013.01); *H01L 21/67748* (2013.01); *H01L 21/823462* (2013.01); *H01L 27/088* (2013.01); *H01L 29/1054* (2013.01); *H01L 29/165* (2013.01); *H01L 29/513* (2013.01); *H01L 29/66545* (2013.01); *H01L 29/0847* (2013.01); *H01L 29/7833* (2013.01); *H01L 29/7851* (2013.01)

(58) Field of Classification Search
CPC ............. H01L 29/408; H01L 21/02236; H01L 27/088; H01L 21/67109; H01L 21/823462; H01L 21/28255; H01L 29/165; H01L 29/66545; H01L 29/513; H01L 29/1054; H01L 29/7833; H01L 29/7851; H01L 29/0847
USPC .................. 257/368, 411, 344, 410; 438/138
See application file for complete search history.

(56) References Cited

U.S. PATENT DOCUMENTS

2011/0272764 A1* 11/2011 Kim .................. H01L 21/28273
                                                              257/368
2014/0001575 A1*  1/2014 Adams ................. H01L 21/845
                                                              257/412

* cited by examiner

*Primary Examiner* — Bo Fan
(74) *Attorney, Agent, or Firm* — Maschoff Brennan

(57) ABSTRACT

A semiconductor device has a semiconductor substrate. A silicon germanium layer is disposed on the semiconductor substrate. The silicon germanium layer has a first silicon-to-germanium ratio. A first gate structure is disposed on the silicon germanium layer, and the first gate structure includes an interfacial layer on the silicon germanium layer. The interface layer has a second silicon-to-germanium ratio substantially the same as the first silicon-to-germanium ratio of the silicon germanium layer. The first gate structure also (Continued)

includes a high-dielectric layer on the interfacial layer and a first gate electrode on the high-κ dielectric layer.

20 Claims, 13 Drawing Sheets

(51) Int. Cl.
*H01L 29/66* (2006.01)
*H01L 29/78* (2006.01)
*H01L 21/677* (2006.01)
*H01L 27/088* (2006.01)
*H01L 29/165* (2006.01)
*H01L 21/8234* (2006.01)

SEMICONDUCTOR DEVICE HAVING INTERFACIAL LAYER AND HIGH κ DIELECTRIC LAYER

CROSS REFERENCE TO RELATED APPLICATION

This application claims priority to U.S. Provisional Application Ser. No. 62/526,984, filed Jun. 29, 2017, which is herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. As the dimensions of transistors decrease, the thickness of the gate dielectric layer must be reduced to maintain performance with the decreased gate length. However, in order to reduce gate leakage, high dielectric constant (high-κ) gate dielectric layers are used which allow lesser physical thicknesses while maintaining the same effective thickness, such as would be provided by a gate dielectric layer used in future technology nodes. The gate dielectric layer further comprises an interfacial layer to reduce damage between the high-κ gate dielectric layer and a silicon substrate.

However, there are challenges to implement such features and processes in complementary metal-oxide-semiconductor (CMOS) fabrication. Typically, wet reagent for example, $H_3PO_4$ and $H_2O_2$, is required in the formation of interfacial layer on the substrate. Soluble oxide material may be consumed by the strong wet chemicals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
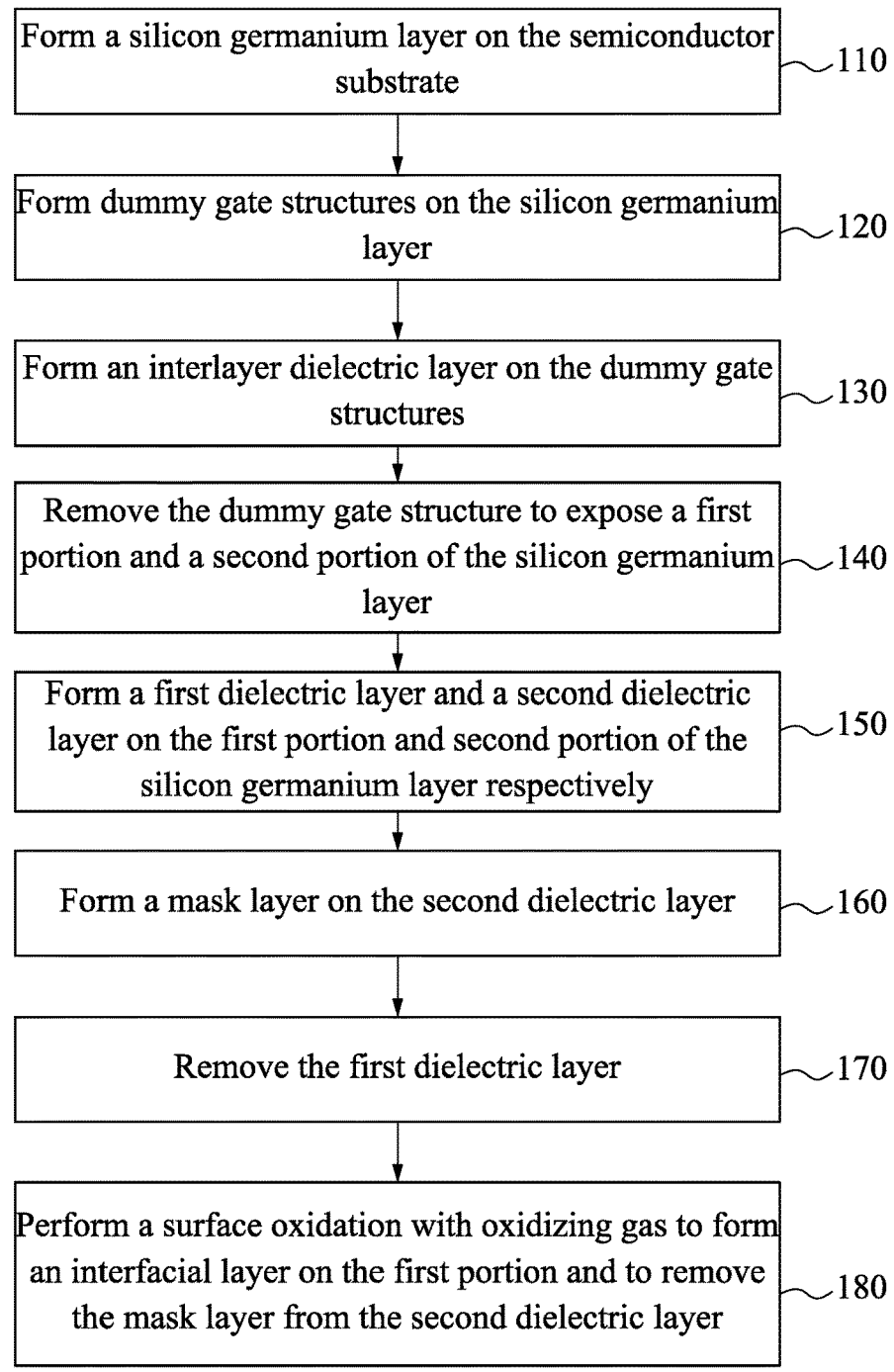
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a flow chart of a method 100 of fabricating a semiconductor device in accordance with some embodiments of the instant disclosure. The method begins with operation 110 in which a silicon germanium layer is formed on a semiconductor substrate. Subsequently, operation 120 is performed. Dummy gate structures are formed on the silicon germanium layer. The method continues with operation 130 in which an interlayer dielectric layer is formed on the dummy gate structures. The method continues with operation 140 in which the dummy gate structures are removed to expose a first portion and a second portion of the silicon germanium layer. The method continues with operation 150 in which a first dielectric layer and a second dielectric layer are formed on the exposed first portion and second portion of the silicon germanium layer respectively. The method continues with operation 160 in which a mask layer is formed on the second dielectric layer. Next, operation 170 is performed. The first dielectric layer is removed. Then in operation 180 a surface oxidation is performed with oxidizing gas to form an interfacial layer on the first portion and to remove the mask layer from the second dielectric layer. The discussion that follows illustrates embodiments of semiconductor devices that can be fabricated according to the method 100 of FIG. 1.

FIGS. 2-15 are schematic cross-sectional views of a semiconductor device 200 comprising an interfacial layer 234 at various stages of fabrication according to various aspects of the instant disclosure. As employed in the instant disclosure, in some embodiments, the semiconductor device 200 may be a planar metal-oxide-semiconductor field effect transistor (MOSFET). In some embodiments, the semiconductor device 200 may be a fin field effect transistor (FinFET). The FinFET refers to any fin-based, multi-gate transistor. Other transistor structures and analogous structures are within the contemplated scope of this disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 15 are simplified for a better understanding of the concepts of the present disclosure. For example, although the figures illustrate the semiconductor device 200, it is understood the IC may comprise a number of other devices comprising resistors, capacitors, inductors, and/or fuses, etc.

Figure 2:
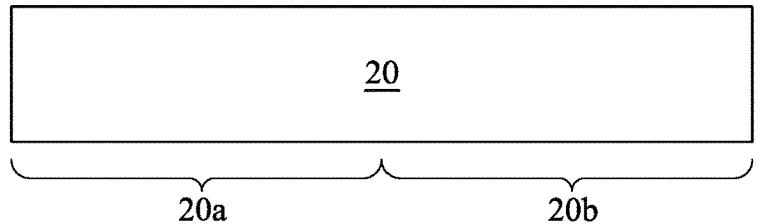
FIGS. 2-15 are cross-sectional views of a portion of a semiconductor device at various stages in a semiconductor device fabrication process in accordance with some embodiments of the instant disclosure.

Reference is made to FIG. 2. A semiconductor substrate 20 is provided. The semiconductor substrate 20 has a core region 20a and an input/output region 20b. In some embodiments, the semiconductor substrate 20 may be a silicon substrate. In some embodiments, the semiconductor substrate 20 may include a silicon-on-insulator (SOI) structure.

Figure 3:
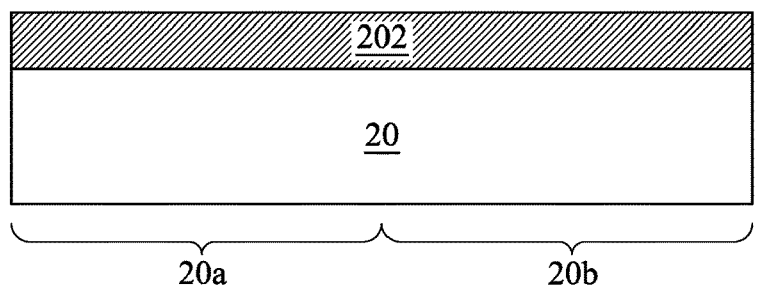

Reference is made to FIG. 3 and operation 110 in FIG. 1. A silicon germanium ($Si_{1-x}Ge_x$) layer 202 is formed on the semiconductor substrate 20, and the x ranges between 0.15 and 0.95. The $Si_{1-x}Ge_x$ layer 202 is epitaxially grown on the surface of the semiconductor substrate 20. Germanium has a higher lattice constant than silicon, and hence the resulting lattice structure of $Si_{1-x}Ge_x$ layer 202 allows higher electron hole mobility than the semiconductor substrate 20.

Further, the semiconductor substrate 20 includes isolation regions (not shown). The isolation regions may be formed on the semiconductor substrate 20 and the $Si_{1-x}Ge_x$ layer 202 to isolate the active regions from other active regions on the semiconductor substrate 20. In some embodiments, the isolation regions include a shallow trench isolation (STI). The active regions may include various doping configurations depending on design requirements. In some embodiments, the active regions may be doped with p-type or n-type dopants. For example, the active regions may be doped with p-type dopants, such as boron or $BF_2$, n-type dopants, such as phosphorus or arsenic, and/or combinations thereof. The active regions may be configured for an n-type FinFET or planar MOSFET, or alternatively configured for a p-type FinFET or planar MOSFET.

Figure 4:
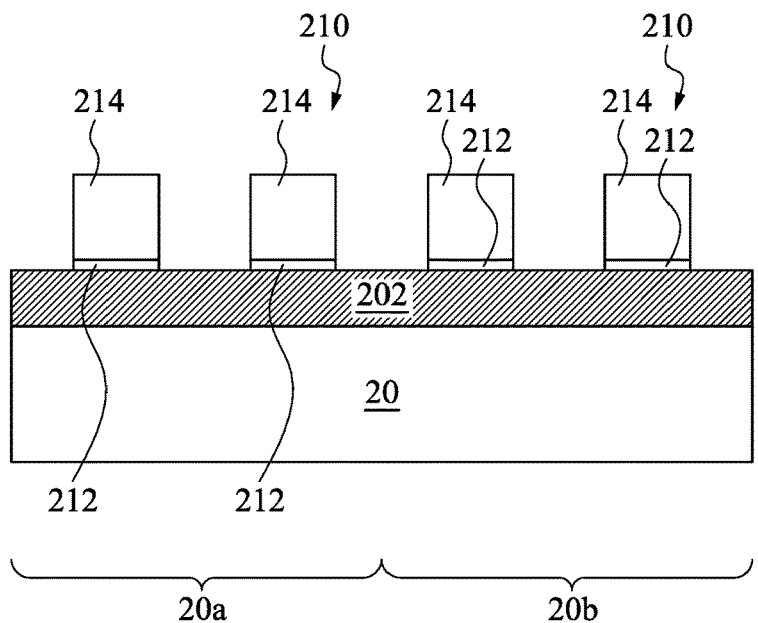

Reference is made to FIG. 4 and operation 120 in FIG. 1. Dummy gate structures 210 are formed on the $Si_{1-x}Ge_x$ layer 202 (semiconductor substrate 20). A dummy gate electrode layer 214 may be formed over a dummy interfacial layer 212. The dummy interfacial layer 212 includes silicon oxide or silicon oxynitride. The dummy interfacial layer 212 can be formed spontaneously as a result of wet cleans of the semiconductor substrate 20 prior to the formation of the dummy gate electrode layer 214. In some embodiments, the dummy gate electrode layer 214 may include a single layer or multilayer structure. In some embodiments, the dummy gate electrode layer 214 includes poly-silicon. Further, the dummy gate electrode layer 214 may be doped poly-silicon with the uniform or gradient doping. The dummy gate electrode layer 214 may have a thickness in the range of about 30 nm to about 60 nm. The dummy gate electrode layer 214 may be formed using a LPCVD process.

Still referring to FIG. 4, then, a layer of photoresist (not shown) is formed over the dummy gate electrode layer 214 by a suitable process, such as spin-on coating, and patterned to form a patterned photoresist feature by a proper lithography patterning method. The patterned photoresist feature can then be transferred using a dry etching process to the underlying layers (i.e., the dummy gate electrode layer 214 and dummy interfacial layer 212) to form dummy gate structures 210. The photoresist layer may be stripped thereafter.

Figure 5:
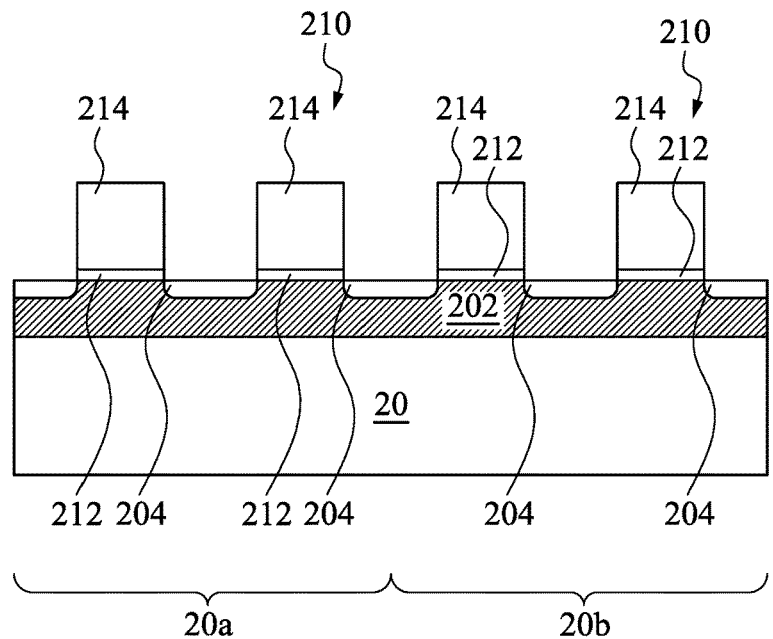

Reference is made to FIG. 5. Lightly doped source/drain (LDD) regions 204 may be formed in the $Si_{1-x}Ge_x$ layer 202 of the semiconductor substrate 20. The LDD regions 204 may be formed in the $Si_{1-x}Ge_x$ layer 202 by one or more ion implantation processes. The doping species may depend on the type of device being fabricated, such as an n-type or p-type device. For example, the LDD regions 204 may be doped with p-type dopants, such as boron or $BF_2$, n-type dopants, such as phosphorus or arsenic, and/or combinations thereof. The LDD regions 204 may include various doping profiles. The LDD regions 204 may be aligned with an outer edge of the dummy gate structures 210 following the ion implantation process.

Figure 6:
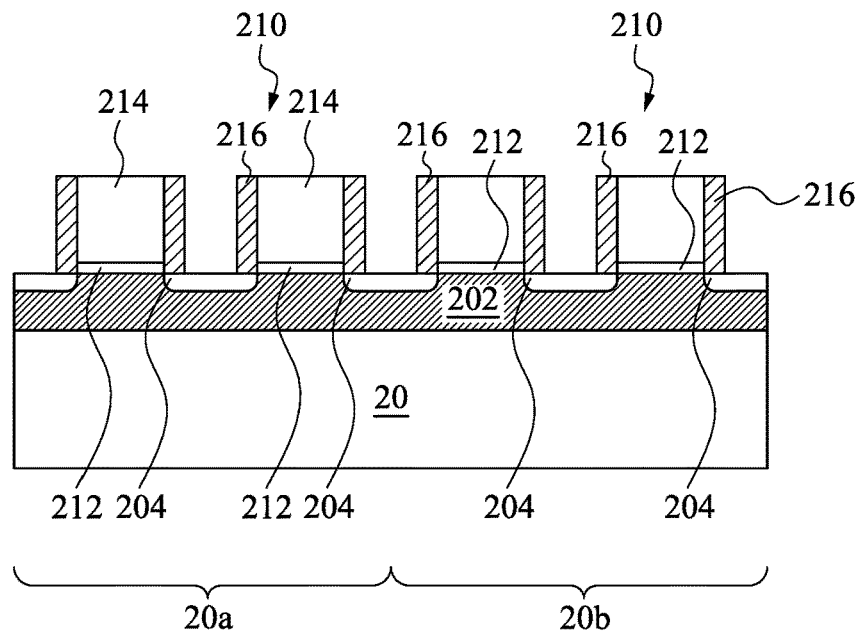

Reference is made to FIG. 6. A dielectric layer, such as silicon nitride or silicon oxynitride, is formed to surround the dummy gate structures 210. The dielectric layer may be formed by plasma deposition at a temperature less than 400° C. and at a pressure of about 200 mTorr to about 1 Torr, using $SiH_4$, $NH_3$ and/or $N_2O$ as reaction gases. Then, an anisotropic etching is performed on the dielectric layer to form a pair of gate spacers 216 on two sides of the dummy gate structures 210. The pair of gate spacers 216 may have a multilayer structure.

Figure 7:
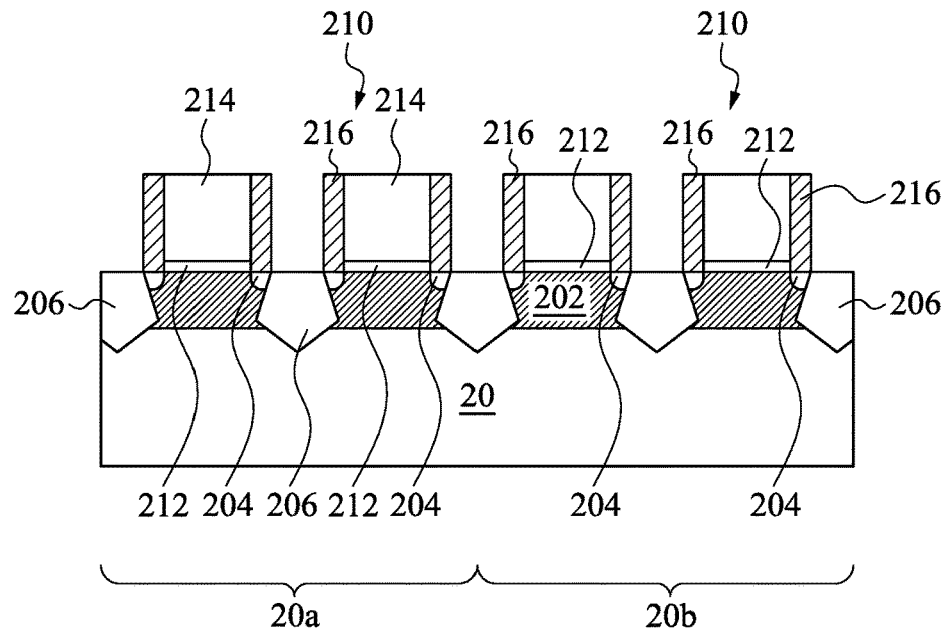

Reference is made to FIG. 7. The pair of gate spacers 216 may be used to offset source/drain (S/D) regions 206. The S/D regions 206 may be formed in the $Si_{1-x}Ge_x$ layer 202 of the semiconductor substrate 20 by epitaxial growth processes. The S/D regions 206 may have various doping profiles, and the S/D regions 206 may be aligned with an outer edge of the spacers 216. The S/D regions 206 may further include raised S/D regions in some embodiments.

Figure 8:
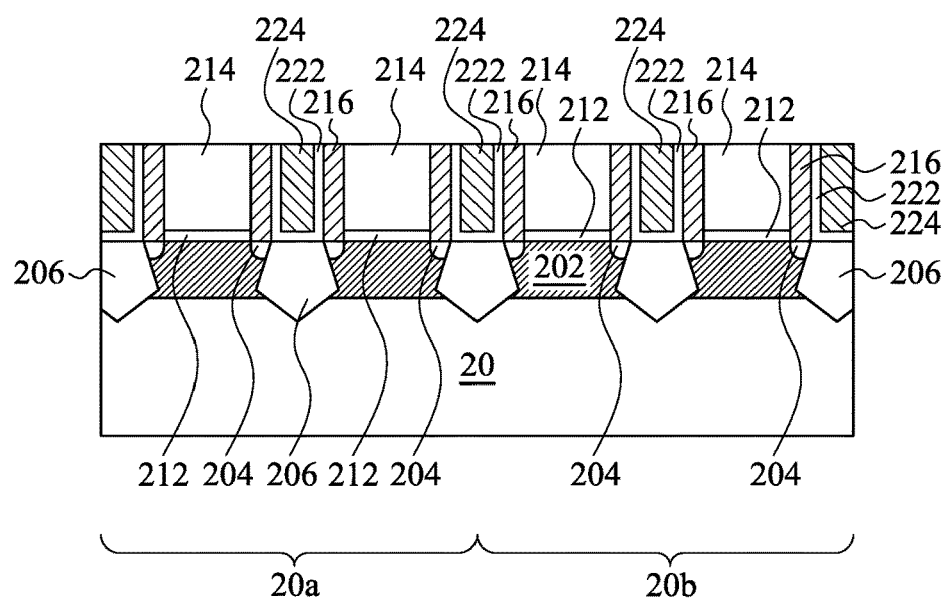

Reference is made to FIG. 8 and operation 130 in FIG. 1. An interlayer dielectric (ILD) layer 224 is formed on the dummy gate structures 210. The ILD layer 224 may be formed over the $Si_{1-x}Ge_x$ layer 202 of the semiconductor substrate 20, including over the dummy gate structures 210. The ILD layer 224 may include a dielectric material. The dielectric material may include silicon oxide, spin-on glass (SoG), fluorinated silica glass (FSG), carbon doped silicon oxide (e.g., SiCOH), SiCN, Black Diamond® (Applied Materials of Santa Clara, Calif.), other suitable dielectric materials, and/or combinations thereof. In some embodiments, the ILD layer 224 may include a high density plasma (HDP) dielectric material and/or a high aspect ratio process (HARP) dielectric material. In some embodiments, before depositing the ILD layer 224, a contact etch stop layer 222 is formed on the surface of the semiconductor substrate 20 including the sidewalls of the spacers 216 and the dummy gate structures 210. Next, the ILD layer 224 is disposed on the contact etch stop layer 222 and fills in the void between the dummy gate structures 210. It is understood that the ILD layer 224 may include one or more dielectric materials and/or one or more dielectric layers.

Subsequently, the ILD layer 224 may be planarized by a chemical-mechanical-polishing (CMP) process until a top portion of the dummy gate structures 210 is exposed. The CMP process may have an advantage to provide a substantially planar surface for the dummy gate structures 210, the pair of gate spacers 222, contact etch stop layer 222, and ILD layer 224. Alternatively, portions of the ILD layer 224 may be partially removed by etching back process. In some embodiments, the dummy gate structure 210 may be surrounded with dielectric including the pair of gate spacers 222, contact etch stop and ILD layer 224.

Figure 9:
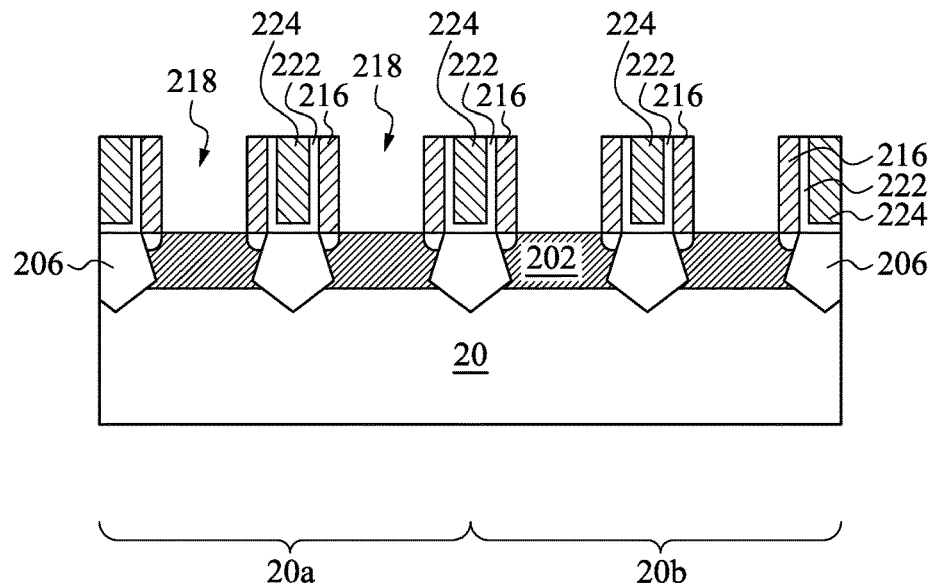

Reference is made to FIG. 9 and operation 140 in FIG. 1. The dummy gate structures 210 are removed to form openings 218 in between the pair of gate spacers 216 by any suitable process. The dummy gate structures 210, including the dummy gate electrode layer 214 and the dummy interfacial layer 212, may be removed using a wet etch process. In some embodiments, the wet etch process for dummy poly-silicon gate structures 210 includes exposure to a hydroxide solution containing ammonium hydroxide, diluted HF, deionized water, and/or other suitable etchant solutions. After the removal of the dummy gate structures 210, portions of the underlying $Si_{1-x}Ge_x$ layer 202 is exposed. The exposed $Si_{1-x}Ge_x$ layer 202 is between the pair of spacers 216. A first portion of the exposed $Si_{1-x}Ge_x$ layer 202 is located over the core region 20a, and a second portion of the exposed $Si_{1-x}Ge_x$ layer 202 is located over the input/output region 20b.

Figure 10:
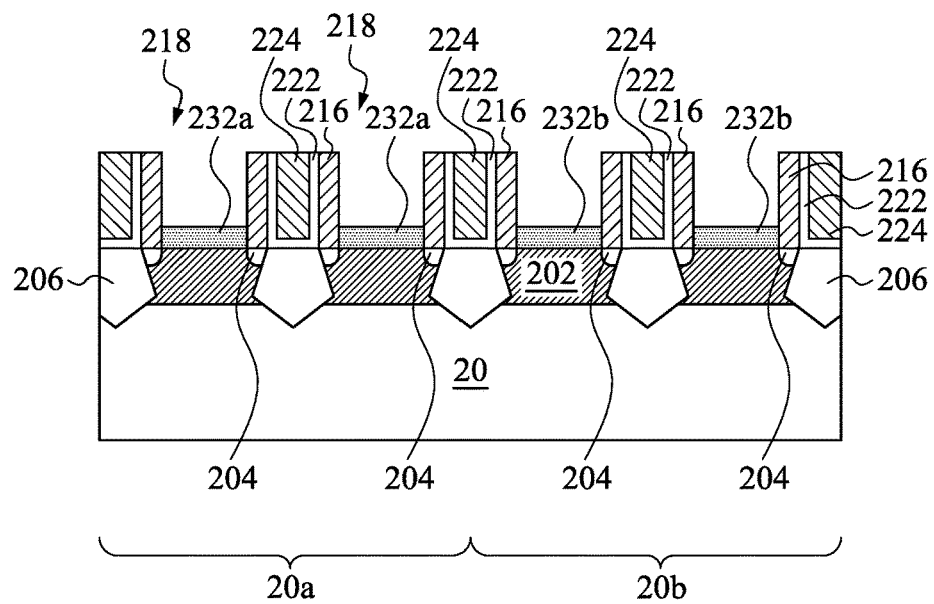

Reference is made to FIG. 10 and operation 150 in FIG. 1. A first dielectric layer 232a and a second dielectric layer 232b is formed on the first portion and the second portion of the exposed $Si_{1-x}Ge_x$ layer 202 respectively. The first and second dielectric layers 232a and 232b may be input/output oxide layer. The first dielectric layer 232a and the second dielectric layer 232b are selectively grown by for example oxidation process over the $Si_{1-x}Ge_x$ layer 202. In some embodiments, the oxidation process is performed at a temperature of about 400 to about 1000° C., using oxygen ($O_2$) as reaction gas. The first dielectric layer 232a and the second dielectric layer 232b have a thickness from approximately 20 to 40 angstroms (Å). The first dielectric layer 232a is formed on the core region 20a of the semiconductor substrate 20, while the second dielectric layer 232b is formed on the input/output region 20b of the semiconductor substrate 20.

Figure 11:
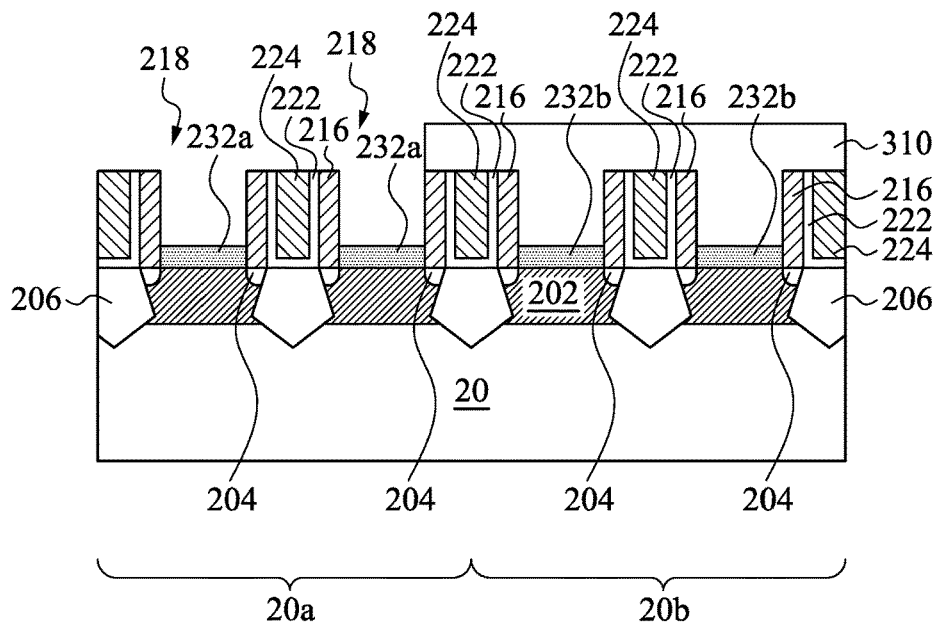

Reference is made to FIG. 11 and operation 160 in FIG. 1. A mask layer 310 is formed on the second dielectric layer 232b over the semiconductor substrate 20 by a suitable process, such as spin-on coating, and patterned to form a patterned mask layer 310 by a proper lithography patterning method. The patterned mask layer 310 covers the input/output region 20b of the semiconductor substrate 20. The second dielectric layer 232b, spacers 216, contact etch stop layer 222, and ILD layer 224 over the input/output region 20b are kept under the patterned mask layer 310. On the other hand, the core region 20a is exposed without the mask layer 310. The first dielectric layer 232a is exposed from the openings 218 left by the dummy gate structures 210.

Figure 12:
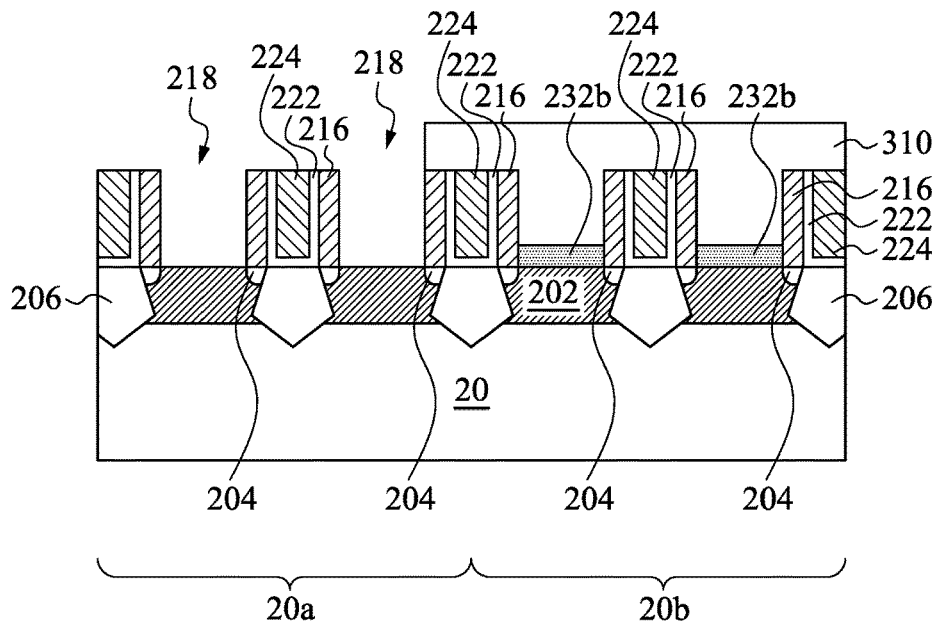

Reference is made to FIG. 12 and operation 170 in FIG. 1. The first dielectric layer 232a on the core region 20a is removed by any suitable process. In some embodiments, selective etching is performed to remove the first dielectric layer 232a, while keeping the patterned mask layer 310 integral. The underlying $Si_{1-x}Ge_x$ layer 202 is then again exposed from the openings 218.

Figure 13:
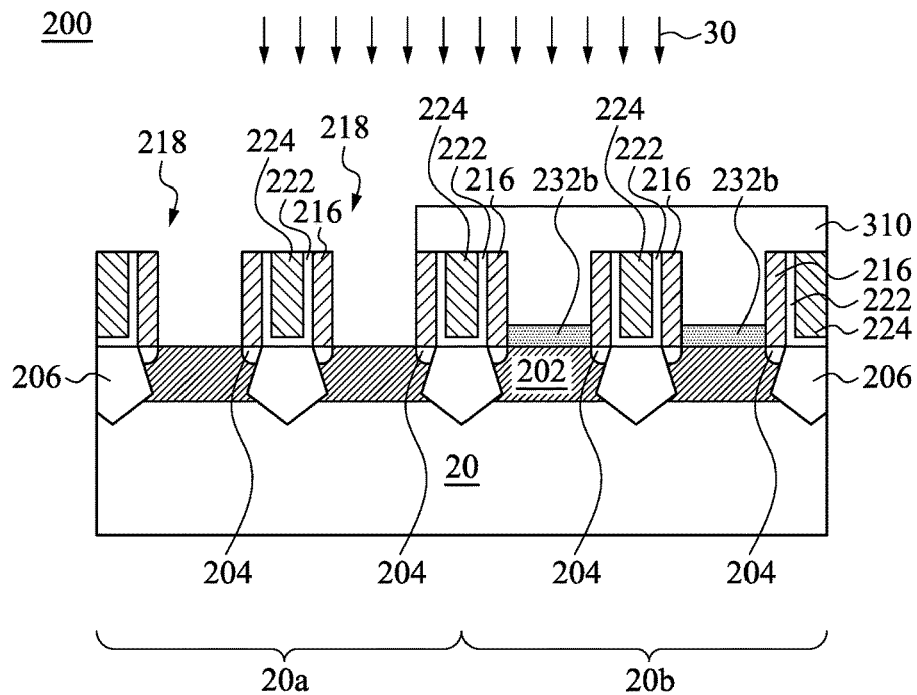

Reference is made to FIG. 13 and operation 180 in FIG. 1. A surface oxidation process 30 is performed. The surface oxidation process 30 is performed by introducing a reactant gas having strong oxidizing ability to the semiconductor substrate 20 and heating up the semiconductor substrate 20. The reactant gas may include ozone ($O_3$), oxygen ($O_2$), hydrogen dioxide, nitrogen dioxide ($NO_2$), sulfur dioxide ($SO_2$) and a combination thereof. The surface oxidation process 30 takes place at a temperature about 250 to 500° C. in a sealed chamber. In some embodiments, inert gas is also introduced along with the reactant gas. The reactant gas and the high temperature result in the formation of an interfacial layer 234 on the surface of the $Si_{1-x}Ge_x$ layer 202 over the core region 20a. In addition, the surface oxidation process 30 results in the decomposition of the patterned mask layer 310 over the input/output region 20b. The surface oxidation process 30 also involves a cooling step after the oxidation takes place in the heated condition. The semiconductor device 200 rests to dissipate the heat obtained from the surface oxidation process 30. The cooling may be facilitated by air-conditioners or coolant assisted cooling plate that contacts the other side of the semiconductor device 200. When the semiconductor device 200 temperature drops to between about 17 and 60° C., the semiconductor device 200 is ready to the next process. It is understood that germanium dioxide ($GeO_2$) is highly soluble in aqueous chemicals in comparison with silicon dioxide ($SiO_2$). Using gas treatment prevents excess moisture or liquid that consumes the oxidation products, germanium dioxide.

The loss of $GeO_2$ is in negative proportion with the heating temperature. For example, when the heating temperature rises from about 250 to 350° C., the loss of $GeO_2$ reduces by at least 5%. The concentration of reactant gas shows positive correlation with the thickness of the interfacial layer 234. In addition, the concentration of reactant gas also has positive correlation with its capacity to remove the mask layer 310. That is, higher the reactant gas concentration, faster the rate of mask layer removal. The formation of interfacial layer 234 and removal of the mask layer 310 take place simultaneously in the surface oxidation process 30. The reactant gas and baking process allows low loss of $GeO_2$, and the strong oxidising ability of the reactant gas helps remove the mask layer 310 at the same time.

Figure 14:
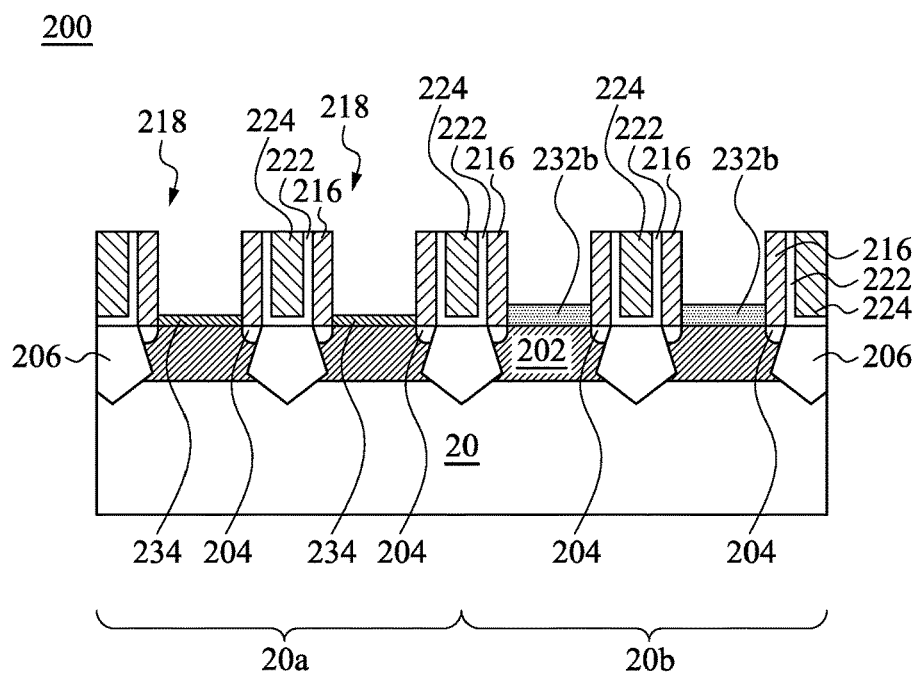

Reference is made to FIG. 14. The resulting interfacial layer 234 has substantially the same silicon-to-germanium ratio (Si:Ge) as the underlying $Si_{1-x}Ge_x$ layer 202. The thickness of the interfacial layer 234 is smaller than the thickness of the remaining second dielectric layer 232b. In some embodiments, the second dielectric layer 232b is made of the same material as the interfacial layer 234, the silicon-to-germanium ratio of the interfacial layer 234 is substantially the same as the second dielectric layer 232b. The interfacial layer 234 has a smooth surface because the dry gas and high temperature condition is less likely to dissolve germanium, or more precisely, germanium dioxide in the treatment process. Germanium dioxide is safely retained in the interfacial layer 234. Therefore the surface of the interfacial layer 234 does not show for example zigzag topology or indentation which is caused by severe loss of $GeO_2$ to the wet chemicals. The smooth surface of the interfacial layer 234 ensures an effective interface between the $Si_{1-x}Ge_x$ layer 202 and the high-κ dielectric and hence improves the performance of the resulting semiconductor device 200.

The terms "substantially" may be applied to modify any quantitative representation which could permissibly vary without resulting in a change in the basic function to which it is related. For example, the silicon-to-germanium ratio of the interfacial layer 234 as disclosed herein being the same as the silicon-to-germanium ratio of the underlying $Si_{1-x}Ge_x$ layer 202 may permissibly have a slight difference if germanium dioxide in the interfacial layer 234 does not suffer from significant loss. In some embodiments, a difference between the first and second silicon-to-germanium ratios is smaller than 5%.

Figure 15:
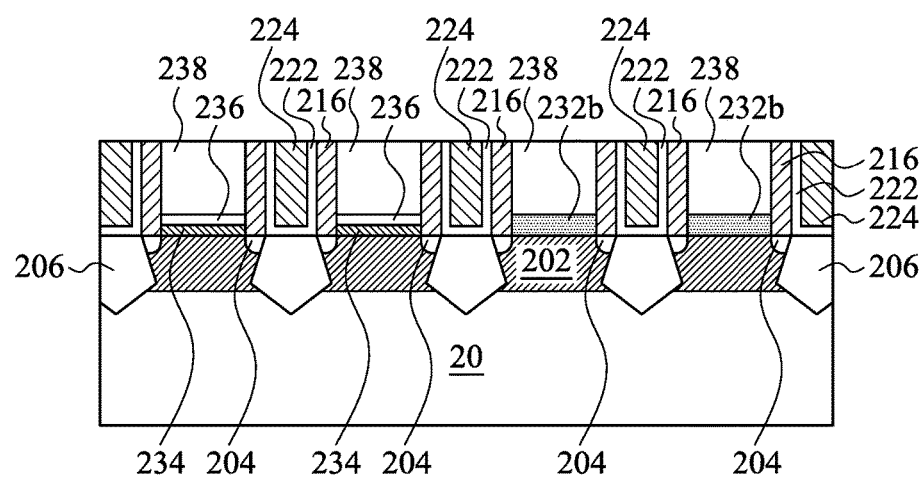

Reference is made to FIG. 15. High-κ dielectric layer 236 and metal gate electrode 238 are formed. A high-κ dielectric material is defined as a dielectric material with a dielectric constant greater than that of $SiO_2$. In some embodiments, the high-κ dielectric layer 236 is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the high-κ dielectric layer 236 comprises hafnium oxide. The high-κ dielectric layer 236 may be formed by chemical vapour deposition process. In some embodiments, low voltage devices are formed on the core region 20a and high voltage devices are formed on the input/output region 20b, and therefore high-κ dielectric layer 236 is not formed on the second dielectric layer 232b. The second dielectric layer 232b serves as the gate oxide for the gate structure. In some embodiments, the high-κ dielectric layer is formed over the input/output region 20b for different device design.

The interfacial layer 234 composed of similar silicon-to-germanium ratio as the underlying $Si_{1-x}Ge_x$ layer 202 is formed between the $Si_{1-x}Ge_x$ layer 202 and the high-κ dielectric layer 236. The function of the interfacial layer 234 is to: passivate dangling bonds at a surface of the substrate and form a high-quality interface with a low-density of defects; create a barrier against interfacial reactions and diffusion into the channel area of a semiconductor device; separate the high-κ dielectric layer 236 from the substrate surface in order to remove charge/traps in the high-κ dielectric layer 236 from the interface; and prevent diffusion of dopants and impurities through the high-κ dielectric layer 236. A smooth surface of the interfacial layer 234 ensures a high-quality interface with a low-density of defects. Thus, the interfacial layer 234 can efficiently passivate dangling bonds at a surface of the $Si_{1-x}Ge_x$ layer 202 and/or remove charge/traps in the high-κ dielectric layer 236 from the interface.

Still referring to FIG. 15, a metal gate electrode layer 238 may be formed to completely fill the openings 218. In some embodiments, the metal gate electrode layer 238 comprises Al, Cu, Ru, Ag, TiAl, TiAlN, TiN, TiCN, TaN, TaCN, WN, or WCN. The metal gate electrode layer 238 may be formed by CVD, PVD, plating, ALD, or other suitable technique. Then, a CMP process may be performed to planarize the metal gate electrode layer 238. The CMP process may remove a portion of the metal gate electrode layer 238 until the top surface of the ILD layer 224 is reached.

Figure 16:
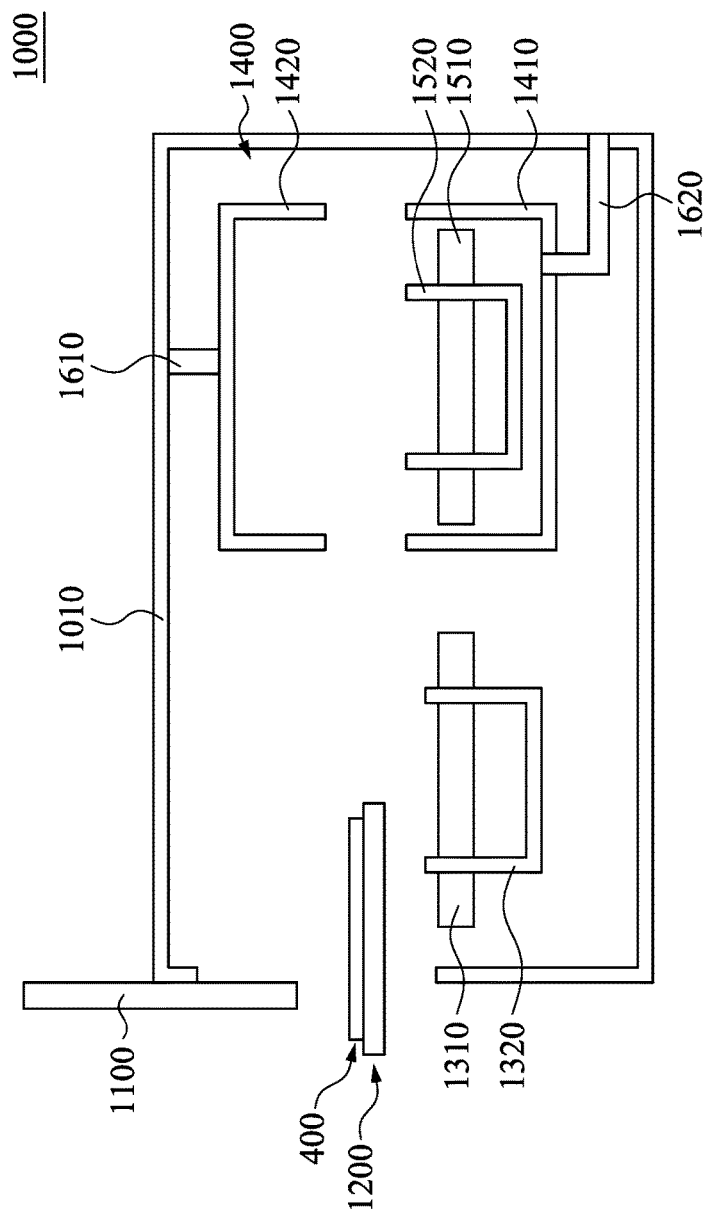
FIGS. 16-20 are cross-sectional views of a portion of an apparatus at various stages in a semiconductor device fabrication process in accordance with some embodiments of the instant disclosure.

Reference is made to FIG. 16. An apparatus 1000 for processing semiconductor device is depicted. The apparatus 1000 has a housing 1010 defining a processing space. The housing 1010 has a shutter 1100 which may open and close to allow wafer entry or make the processing space a closed compartment. As shown in FIG. 16, a wafer 400 which is similar to the semiconductor device as shown in FIG. 12 is transferred to the apparatus 1000. The shutter 1100 opens to allow admission of the wafer 400, and a transfer assembly 1200 carries the wafer 400 around in the housing 1010.

Figure 17:
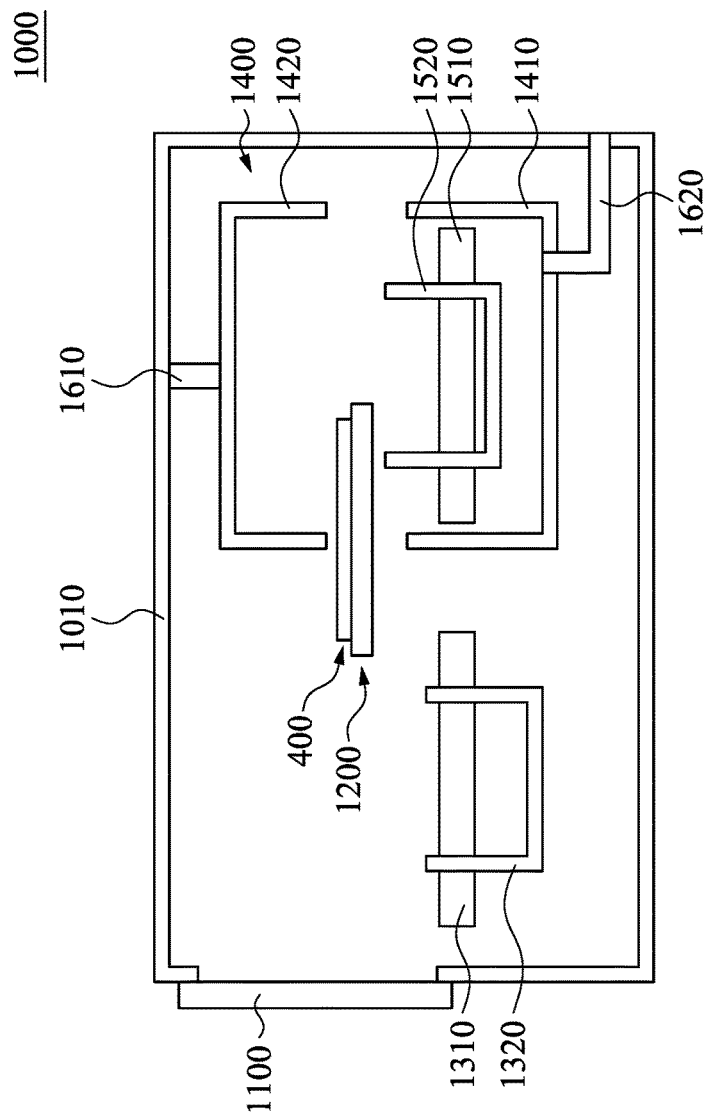

Reference is made to FIG. 17. The shutter 1100 closes, and the transfer assembly 1200 takes the wafer 400 into a process chamber 1400. The process chamber 1400 has a chamber body 1410 having an opening. The process chamber 1400 also includes a chamber lid 1420 that can seal the opening of the chamber body 1410 from the top such that the process chamber 1400 becomes an air tight space. The chamber body 1410 and the chamber lid 1420 collectively define a process volume in between. A gas inlet is coupled to the chamber lid 1420 for allowing foreign particle communication. The gas inlet is coupled to the upper portion of the process volume which is between the heating plate 1510 and the chamber lid 1420. The process volume receives a heating plate 1510 therein. The heating plate 1510 is capable of rising to a temperature up to about 600° C. A lifting pin 1520 is movably coupled to the heating plate 1510. As shown in FIG. 17, the lifting pin 1520 goes through the heating plate 1510 and protrudes over the surface of the heating plate 1510. The lifting pin 1520 is configured to receive the wafer and retain the wafer atop. The lifting pin 1520 may travel in a linear direction that is substantially perpendicular to the heating plate 1510. When the lifting pin 1520 goes forward, the tip of the lifting pin 1520 moves further away from the heating plate 1510. When the lifting pin 1520 goes backward, the tip of the lifting pin 1520 moves closer to the heating plate 1510. The transfer assembly 1200 delivers the wafer 400 into the process chamber 1400 and loads the wafer 400 onto the lifting pin 1520.

Figure 18:
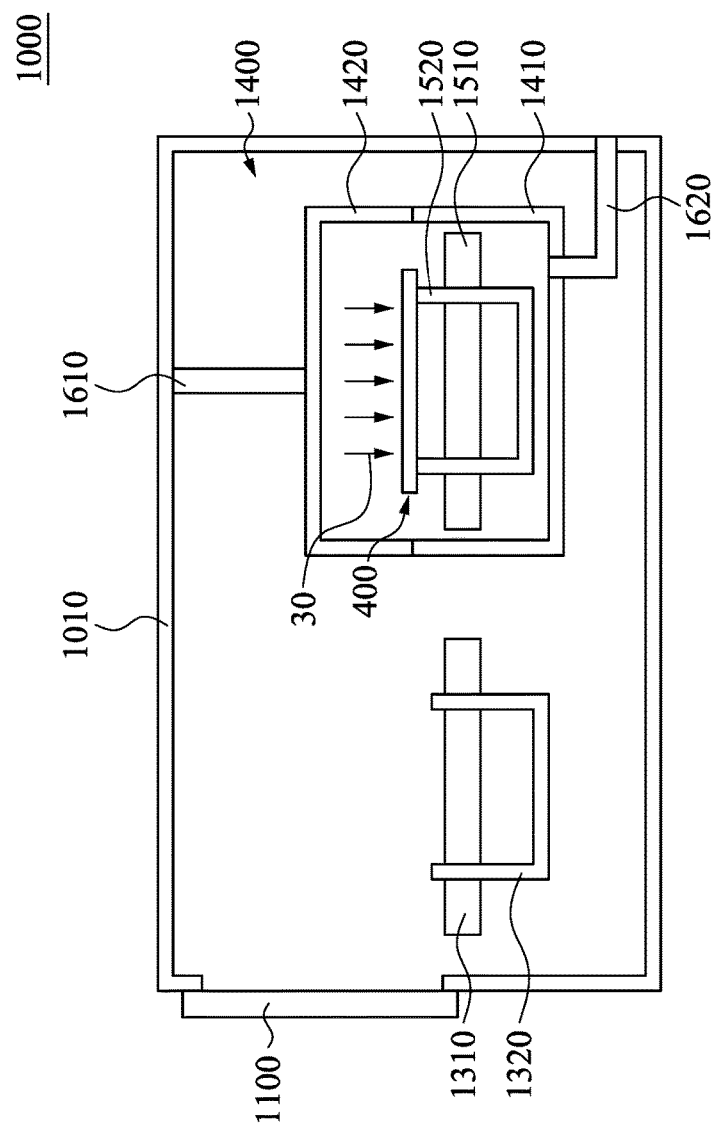

Reference is made to FIG. 18. The chamber lid 1420 closes up and seals the process chamber 1400. The lifting pin 1520 lowers to a level that makes the wafer 400 proximate to the heating plate 1510. When the heating plate 1510 heats up to a predetermined temperature for example about 400° C., the gas inlet 1610 admits reactant gas into the process chamber 1400. The surface oxidation process 30 as previously discussed takes place as the reactant gas is introduced to the sealed process chamber 1400 with a predetermined concentration and flow rate. The gas inlet 1610 is coupled to a gas source (not shown) that supplies reactant gas to the process chamber 1400. The reactant gas flows out of the gas inlet 1610 from the chamber lid 1420 and contacts the front side of the wafer 400. In some embodiments, inert gas is also introduced into the process chamber 1400 through the gas inlet 1610. Exhaust gas produced during the surface oxidation process is drawn out of the process chamber 1400 through an exhaust duct 1620 at the bottom portion of the process volume. The bottom portion refers to the region between the heating plate 1510 and the chamber body 1410. The interfacial layer is then formed, and at the same time the mask layer is removed under the strong oxidising agent and heat.

Figure 19:
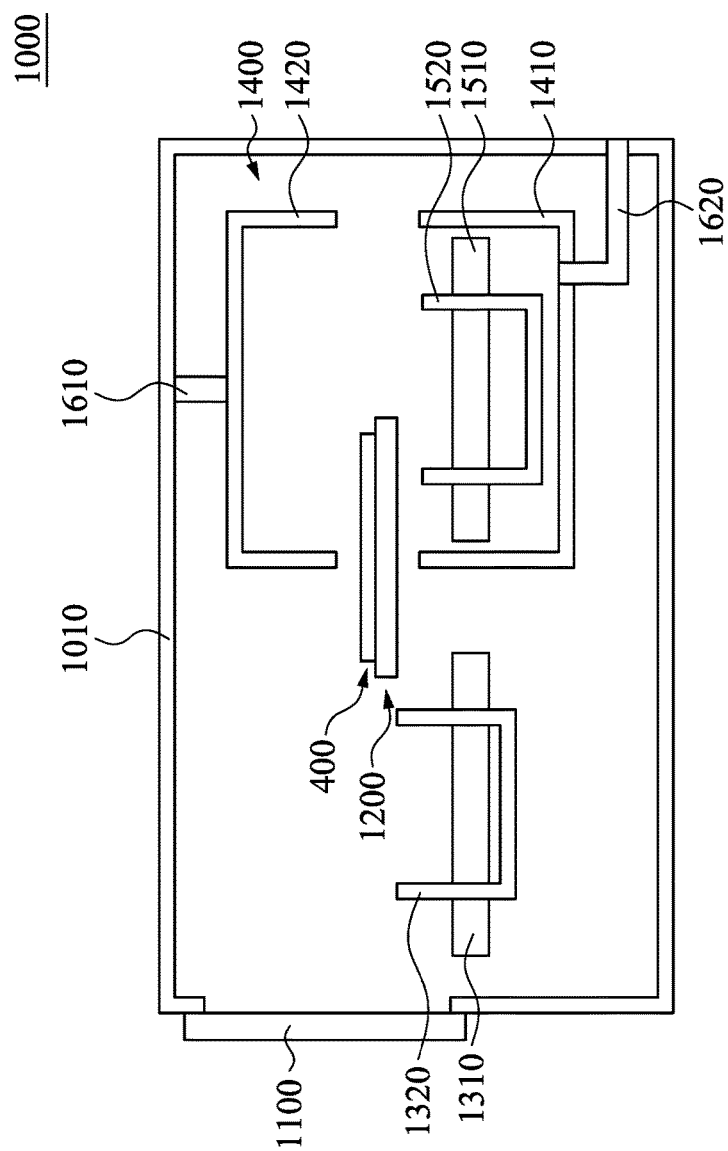

Reference is made to FIG. 19. The chamber lid 1420 opens to allow the wafer 400 to be transferred out of the process chamber 1400. The lifting pin 1320 of the cooling plate 1310 is positioned to receive the wafer 400 thereon.

Figure 20:
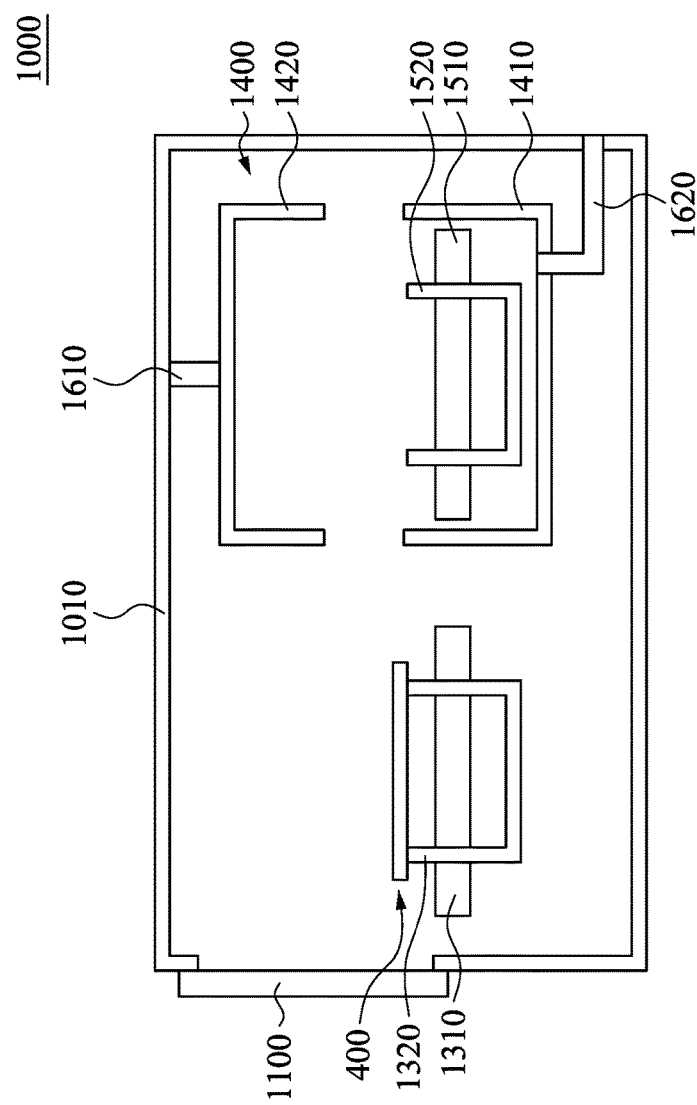

Reference is made to FIG. 20. The lifting pin 1320 lowers down to a level such that the wafer 400 is at proximity to the cooling plate 1310. The wafer 400 may be allowed to rest on the cooling plate 1310 until the temperature gradually drops to about 15 to 60° C. The cooling process may be facilitated by for example ventilation system that introducing cold air on the wafer 400. In some embodiments, the cooling plate may produce coolant and spread the coolant at the backside of the wafer 400 to speed up the cooling process. In some embodiments, after surface oxidation and cooling process, cleaning and rinsing are applied to remove residues on the wafer 400, and a drying step may follow after the post-surface oxidation cleaning.

The formation of the interfacial layer is performed in a relatively dry condition with reactant gas under higher temperature. The interfacial layer is formed on the silicon germanium layer and has substantially the same silicon and germanium ratio as the underlying silicon germanium layer because the dry reactant gas is less likely to consume germanium dioxide. The mask layer that covers the input/output region on the semiconductor substrate is removed at the same time by the strong oxidising gas that oxidizes the silicon germanium layer. The concentration of the reactant gas and the reaction temperature has positive correlation with the thickness and quality of the interfacial layer.

In some embodiments, a semiconductor device has a semiconductor substrate. A silicon germanium layer is disposed on the semiconductor substrate. The silicon germanium layer has a first silicon-to-germanium ratio. A first gate structure is disposed on the silicon germanium layer, the first gate structure includes an interfacial layer on the silicon germanium layer. The interface layer has a second silicon-to-germanium ratio substantially the same as the first silicon-to-germanium ratio. The first gate structure also includes a high-κ dielectric layer on the interfacial layer and a first gate electrode on the high-κ dielectric layer.

In some embodiments, a method of fabricating a semiconductor device is provided. A first dummy gate structure and a second dummy gate structure are formed on a semiconductor substrate. An interlayer dielectric layer is formed on the first dummy gate structure, the second dummy gate structure, and the semiconductor substance. The first dummy gate structure and the second dummy gate structure are removed to expose a first portion and a second portion of the semiconductor substance. A first dielectric layer and a second dielectric layer are formed respectively on the first portion and the second portion of the semiconductor substance. A mask layer is formed on the second dielectric layer. The first dielectric layer is removed to expose the first portion of the semiconductor substrate. A first surface oxidation is performed with an oxidizing gas to form an interfacial layer on the first portion of the semiconductor substrate and to remove the mask layer from the second dielectric layer.

In some embodiments, an apparatus for processing a wafer includes a chamber body having an opening. A chamber lid configured to cover the opening of the chamber body and define a process volume with the chamber body. The chamber lid is movable relative to the chamber body. A heating plate disposed in the process volume. A cooling plate is disposed external to the process volume. A transfer assembly is configured to move the wafer between the cooling plate and the heating plate. A gas inlet is in communication with the process volume, and an exhaust duct is in communication with the process volume.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    forming a first dummy gate structure and a second dummy gate structure on a semiconductor substrate;
    forming an interlayer dielectric layer on the first dummy gate structure, the second dummy gate structure, and the semiconductor substrate;
    removing the first dummy gate structure and the second dummy gate structure to expose a first portion and a second portion of the semiconductor substrate;
    forming a first dielectric layer and a second dielectric layer respectively on the first portion and the second portion of the semiconductor substrate;
    forming a mask layer on the second dielectric layer;
    removing the first dielectric layer to expose the first portion of the semiconductor substrate; and
    performing a first surface oxidation with an oxidizing gas to form an interfacial layer on the first portion of the semiconductor substrate and to remove the mask layer from the second dielectric layer.

2. The method of claim 1, wherein the oxidizing gas comprises ozone, oxygen, hydrogen dioxide, nitrogen dioxide, sulfur dioxide, or combinations thereof.

3. The method of claim 1, further comprising:
    forming a high-κ dielectric layer on the interfacial layer.

4. The method of claim 3, further comprising:
    forming a gate electrode on the high-κ dielectric layer.

5. The method of claim 1, wherein the interlayer dielectric layer comprises germanium dioxide.

6. The method of claim 1, further comprising:
    introducing an inert gas into a process chamber in which the first surface oxidation is performed.

7. The method of claim 1, wherein the semiconductor substrate comprises germanium.

8. The method of claim 1, wherein the forming the first dielectric layer and the second dielectric layer comprises:
    performing a second surface oxidation to form the first dielectric layer and the second dielectric layer respectively on the first portion and the second portion of the semiconductor substrate.

9. A method of fabricating a semiconductor device, the method comprising:
    forming a first dummy gate structure and a second dummy gate structure on a semiconductor substrate;
    forming an interlayer dielectric layer on the first dummy gate structure, the second dummy gate structure, and the semiconductor substrate;
    removing the first dummy gate structure and the second dummy gate structure to expose a first portion and a second portion of the semiconductor substrate;
    forming a first dielectric layer and a second dielectric layer respectively on the first portion and the second portion of the semiconductor substrate;
    forming a mask layer on the second dielectric layer;
    removing the first dielectric layer to expose the first portion of the semiconductor substrate;
    forming an interfacial layer on the first portion of the semiconductor substrate; and
    removing the mask layer from the second dielectric layer at the same time as forming the interfacial layer.

10. The method of claim 9, further comprising:
    forming a high-κ dielectric layer on the interfacial layer.

11. The method of claim 10, further comprising:
    forming a gate electrode on the high-κ dielectric layer.

12. The method of claim 9, wherein the interlayer dielectric layer comprises germanium dioxide.

13. The method of claim 9, wherein the semiconductor substrate comprises germanium.

14. The method of claim 9, wherein the forming the first dielectric layer and the second dielectric layer comprises:
    performing a surface oxidation to form the first dielectric layer and the second dielectric layer respectively on the first portion and the second portion of the semiconductor substrate.

15. A method of fabricating a semiconductor device, the method comprising:
    forming a first dummy gate structure and a second dummy gate structure on a semiconductor substrate;
    forming an interlayer dielectric layer on the first dummy gate structure, the second dummy gate structure, and the semiconductor substrate;
    removing the first dummy gate structure and the second dummy gate structure to expose a first portion and a second portion of the semiconductor substrate;
    forming a first dielectric layer and a second dielectric layer respectively on the first portion and the second portion of the semiconductor substrate;
    forming a mask layer on the second dielectric layer;
    removing the first dielectric layer to expose the first portion of the semiconductor substrate; and
    introducing a reactant gas and heating the semiconductor substrate to form an interfacial layer on the first portion of the semiconductor substrate and to remove the mask layer from the second dielectric layer at the same time as forming the interfacial layer.

16. The method of claim 15, further comprising:
forming a high-κ dielectric layer on the interfacial layer.

17. The method of claim 16, further comprising:
forming a gate electrode on the high-κ dielectric layer.

18. The method of claim 15, wherein the interlayer dielectric layer comprises germanium dioxide.

19. The method of claim 15, wherein the semiconductor substrate comprises germanium.

20. The method of claim 15, wherein the forming the first dielectric layer and the second dielectric layer comprises:
performing a surface oxidation to form the first dielectric layer and the second dielectric layer respectively on the first portion and the second portion of the semiconductor substrate.

* * * * *